US006920072B2

(12) United States Patent
Theel

(10) Patent No.: US 6,920,072 B2
(45) Date of Patent: Jul. 19, 2005

(54) APPARATUS AND METHOD FOR TESTING REDUNDANT MEMORY ELEMENTS

(75) Inventor: Wayne Arthur Theel, Plymouth, MN (US)

(73) Assignee: Union Semiconductor Technology Corporation, Plymouth, MN (US)

( * ) Notice: Subject to any disclaimer, the term of this patent is extended or adjusted under 35 U.S.C. 154(b) by 160 days.

(21) Appl. No.: 10/377,449

(22) Filed: Feb. 28, 2003

(65) Prior Publication Data

US 2004/0170069 A1 Sep. 2, 2004

(51) Int. Cl.[7] ............................................... G11C 29/00
(52) U.S. Cl. .................. 365/200; 365/201; 365/189.12
(58) Field of Search ................................ 365/200, 201, 365/189.12

(56) References Cited

U.S. PATENT DOCUMENTS

| | | | |
|---|---|---|---|
| 4,860,260 A | 8/1989 | Saito et al. | |
| 5,239,509 A | 8/1993 | Ikawa et al. | |
| 5,297,148 A | * 3/1994 | Harari et al. | ................ 714/710 |
| 5,303,192 A | * 4/1994 | Baba | .......................... 365/200 |
| 5,327,382 A | 7/1994 | Seno et al. | |
| 5,404,331 A | 4/1995 | McClure | |
| 5,631,868 A | 5/1997 | Termullo et al. | |
| 5,639,167 A | 6/1997 | Hans et al. | |
| 5,841,709 A | 11/1998 | McClure | |
| 5,859,801 A | * 1/1999 | Poechmueller | ............... 365/200 |
| 6,158,016 A | 12/2000 | Pignon | |
| 6,250,757 B1 | 6/2001 | Roffman et al. | |
| 6,310,804 B1 | 10/2001 | Waller et al. | |
| 6,400,621 B2 | 6/2002 | Hidaka et al. | |
| 6,442,063 B2 | 8/2002 | Hartmann | |

* cited by examiner

Primary Examiner—Vu A. Le
(74) Attorney, Agent, or Firm—Jones Day

(57) ABSTRACT

A semiconductor device includes a primary memory array, primary addressing circuitry, a redundant memory array, redundant addressing circuitry, and a first signal pad. The primary memory array includes primary memory elements operable to store data, and the primary addressing circuit is operable to select the primary memory elements. The redundant memory array includes redundant memory elements operable to store data and is also operable to be programmed from a programmable state to provide redundant memory elements for defective primary memory elements. The first signal pad is operable to receive serial selection data, and the redundant addressing circuit is connected to the first signal pad and is operable to receive the serial selection data from the first signal pad and select the redundant memory elements in response.

29 Claims, 5 Drawing Sheets

APPARATUS AND METHOD FOR TESTING REDUNDANT MEMORY ELEMENTS

BACKGROUND

1. Technical Field

The invention relates in general to semiconductor devices, and more particularly to systems and methods for testing redundant memory elements.

2. Description of the Related Art

A semiconductor device, such as a semiconductor memory device, typically comprises a primary memory array defined by primary rows and primary columns. Illustratively, each row in the primary memory array may represent a word line, and each column in the primary memory array may represent a bit line. The intersection of each row and column may comprise a storage device, such as a dynamic random access memory (DRAM) cell or a magnetoresistive random access memory (MRAM) cell.

During the manufacturing process of the semiconductor device, the primary memory array is tested for defects. If as few as one memory cell is found to be defective, the entire semiconductor device may be considered defective. Thus, to increase yield, the semiconductor device typically includes a redundant memory array defined by redundant rows and redundant columns in the same manner as the primary memory array. Programmable addressing circuitry connected to the primary memory array and the redundant memory array can be programmed to provide redundant rows and redundant columns in the redundant memory array for defective primary rows and primary columns in the primary memory array. The programming of the addressing circuitry is typically accomplished by laser trimming of fuses in a fuse bank.

Because laser trimming the fuses is a permanent process, the redundant memory array is typically tested before selecting a redundant row or redundant column to replace a defective primary row or primary column so as to ensure that a defective redundant row or redundant column is not used to replace the defective primary row or primary column. Test circuitry to support such redundant testing is thus built into the semiconductor device during manufacture. The test circuitry may include a plurality of test pads for receiving test data, and associated test support circuitry, such as addressing circuitry. After the testing and repair process, however, these test pads and support circuitry are typically no longer used.

SUMMARY

A semiconductor device comprises a primary memory array and primary addressing circuit, a redundant memory array and a redundant addressing circuit, and a first signal pad. The primary memory array comprises primary memory elements operable to store data, and the primary addressing circuit is operable to select the primary memory elements. The redundant memory array comprises redundant memory elements operable to store data, and the redundant memory array is operable to be programmed from a programmable state to provide redundant memory elements for defective primary memory elements. The first signal pad is operable to receive serial selection data. The redundant addressing circuit is connected to the first signal pad and is operable to receive the serial selection data from the first signal pad and select the redundant memory elements in response.

A method of testing redundant memory elements in a semiconductor device is provided. The redundant memory elements are selectable by a redundant addressing device. The method comprises the steps of receiving serial selection data through a first test pad on the semiconductor device, accessing a corresponding redundant memory element in response to the serial selection data received, and disabling the selection of primary memory elements.

Another method of testing redundant memory elements in a semiconductor device is provided. The redundant memory elements are selectable by a redundant addressing device. The method comprises the steps of generating serial selection data corresponding to the selection of redundant memory elements in the semiconductor device and providing the serial selection data to a first test pad on the semiconductor device. A memory test of the redundant memory elements corresponding to the serial selection data provided is conducted to determine whether the redundant memory elements under test pass the memory test. Address data is then stored of redundant memory elements that fail the memory test.

DETAILED DESCRIPTION

Figure 1:
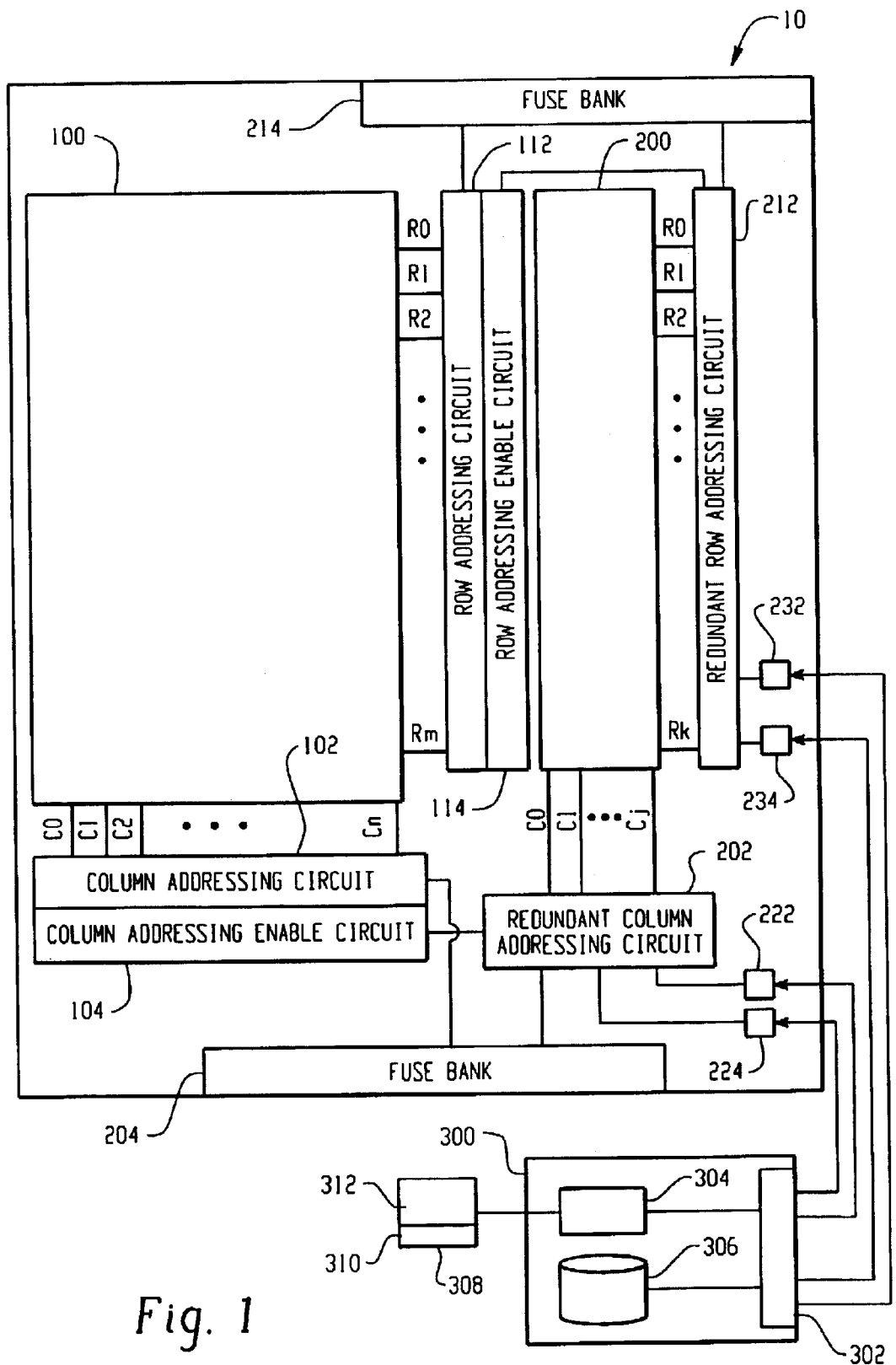
FIG. 1 is a block diagram of an illustrative semiconductor device including redundant addressing and test circuitry for redundant memory elements.

FIG. 1 is a block diagram of an illustrative semiconductor device 10 including redundant addressing and test circuitry for accessing and testing redundant memory elements. The semiconductor device 10 includes a primary memory array 100 and a redundant memory array 200. The primary memory array 100 comprises a plurality of memory elements operable to store data. Typically, the memory elements comprise a plurality of primary columns C0, C1, C2 . . . Cn and primary rows R0, R1, R2 . . . Rm. The intersection of each primary row R and primary column C may comprise a storage device, such as a DRAM cell or an MRAM cell. Each cell is accessed by selecting a corresponding primary column C and primary row R by a column addressing circuit 102 and a row addressing circuit 112, respectively.

The redundant memory array 200 also comprises a plurality of redundant memory elements operable to store data. Typically, the redundant memory elements comprise a plurality of redundant columns C0, C1, C2 . . . Cj and redundant rows R0, R1, R2 . . . Rk. The intersection of each redundant row R and redundant column C may comprise a storage device, such as a DRAM cell or an MRAM cell. Each cell is accessed by selecting a corresponding redundant column C and redundant row R by a redundant column addressing circuit 202 and a redundant row addressing circuit 212, respectively.

During the manufacturing process of the semiconductor device 10, the primary memory array 100 is tested for defects. Primary columns and primary rows are selected via the column addressing circuit 102 and row addressing circuit 112, and data is written to and read from the selected memory elements. Performance characteristics, such as standby current, data retention, memory access time, and other performance characteristics may be measured to determine whether a selected memory element meets a performance specification. If the selected memory element does not meet the specification, then the selected memory element is considered defective. Programmable addressing circuitry, such as fuse banks 204 and 214, may be programmed to provide redundant rows and redundant columns in the redundant memory array 200 for defective primary rows and primary columns in the primary memory array 100. Typically, fuse banks 204 and 214 may be programmed by laser trimming. Other programming circuitry and methods may also be used.

The semiconductor device 10 of FIG. 1 provides for the testing of the redundant memory array 200 before the selection of a redundant row or redundant column to replace a defective primary row or primary column. This pretest of the redundant memory array 200 ensures that a defective redundant row or redundant column in the redundant memory array 200 is not used to replace a defective primary row or primary column in the primary memory array 100.

A testing device 300, such as a programmable test station, conducts a memory test of the primary memory array 100 and the redundant memory array 200. An illustrative testing device 300 includes a first input/output (I/O) device 302 operable to provide test signal data to the semiconductor device 10, a processor 304 operable to execute programmed instructions, and a storage device 306 operable to store program instructions for execution by the processor 304, and to store memory test related data. A second I/O device 308, such as a workstation terminal comprising a keyboard 310 and a terminal 312, may also be provided to facilitate operator control.

The testing device 300 provides serial column selection data to the first column signal pad 222, typically via a test probe at the wafer level. The first column signal pad 222 in turn provides the serial column selection data to the redundant column addressing circuit 202. The redundant column addressing circuit 202 selects one of the redundant columns C0, C1, C2, . . . Cj based on the serial column selection data received.

In one embodiment, the redundant column addressing circuit 202 is also operable to disable the column addressing circuit 102 by providing a disable signal to the column addressing enable circuit 104. The column addressing enable circuit 104 may be a separate circuit that disables the output of the column addressing circuit 102, such as an array of AND gates, each receiving as input a corresponding column addressing circuit 102 output and the disable signal from the redundant column addressing circuit 202. If the disable signal is low, then the outputs of the column addressing circuit 102 are disabled. Alternatively, the disable signal may be inverted prior to being input into the array of AND gates so that the outputs of the column addressing circuit 102 are disabled when the disable signal is high.

In another embodiment, the column addressing circuit 102 is a decoder and the column addressing enable circuit 104 is an enable/disable input for a typical decoder. Other types of logic circuits operable to select primary columns C0, C1, C2 . . . Cn and selectively enable and disable the output of the column addressing circuit 102 may also be used.

In a similar manner, a redundant row signal pad 232 receives serial row selection data, and the row addressing circuit 112, row addressing enable circuit 114, and redundant row addressing circuit 212 operate in a similar manner as the column addressing circuit 102, column addressing enable circuit 104, and redundant column addressing circuit 202. The testing device 300 may then test the redundant memory array 200 for defects at the selected redundant row R and redundant column C.

If the selected redundant memory element is found to be defective, its corresponding address is stored in the storage device 306 of the test device 300. Another memory element is then accessed by incrementing the serial column selection data, the serial row selection data, or both the serial column selection data and the serial row selection data, and the testing process is repeated until all redundant rows and redundant columns in the redundant memory array are tested.

By thus conducting a performance test for all redundant rows R and redundant columns C, a list of defective redundant memory elements may be obtained. The testing device 300 will thereafter store the list of defective redundant memory elements in the storage device 306. This list of defective redundant memory elements can then be accessed during the programming of the programmable access circuitry, such as the fuse banks 204 and 214, to preclude the programming of a defective redundant row or redundant column in the redundant memory array 200 to replace a defective primary row or primary column in the primary memory array 100.

In one embodiment, the serial selection data provided to the first column signal pad 222 and the redundant row signal pad 232 is clocked in serially by using a system clock provided to a separate system clock pad on the semiconductor device 10, or generated by a system clock on the semiconductor device 10.

In another embodiment, a second column signal pad 224 and second row signal pad 234 are operable to receive a column test enable signal and a row test enable signal, respectively. In a variation of this embodiment, the redundant column addressing circuit 202 and the redundant row addressing circuit 212 are configured to be clocked on a leading edge of a digital signal provided to the second column signal pad 224 and second row signal pad 234. The column test signal and the row test signal may then also provide clock signals for the redundant column addressing circuit 202 and the redundant row addressing circuit 212, respectively.

In another embodiment, the column test enable signal and the row test enable signal may also be provided to the column addressing enable circuit 104 and the row addressing enable circuit 114 to selectively disable and enable the column addressing circuit 102 and the row addressing circuit 112. In a variation of this embodiment, the column addressing enable circuit 104 disables the column addressing circuit 102 when the column test enable signal is high. Likewise, the row addressing enable circuit 114 disables the row addressing circuit 112 when the row test enable signal is high. Thus, by configuring the redundant column addressing circuit 202 and the redundant row addressing circuit 212 to be clocked on a leading edge of a digital signal, the column test enable signal and the row test enable signal also provide a test clock signal for the redundant column addressing circuit 202 and the redundant row addressing circuit 212.

Accordingly, the column test enable signal may be cycled to clock in the serial column selection data to the redundant column addressing circuit 202. Once the serial column serial selection data has been clocked into the redundant column addressing circuit 202, the column test enable signal can be held high to disable the column addressing circuit 102. Likewise, the row test enable signal may be cycled to clock in the serial row selection data to the redundant row addressing circuit 212. Once the serial row selection data has been clocked into the redundant row addressing circuit 212, the row test enable signal can be held high to disable the row addressing circuit 112. The redundant memory array 200 may then be tested for defects at the selected redundant column C and redundant row R.

After the testing and repair of the semiconductor device 10 is complete, the signal pads 222, 224, 232, and 234 are no longer used. Thus, by providing a means to test the redundant memory array 100 using serial selection data, space on the semiconductor device 10 is conserved and possibly utilized for additional circuitry that is operable after the testing process.

Figure 2:
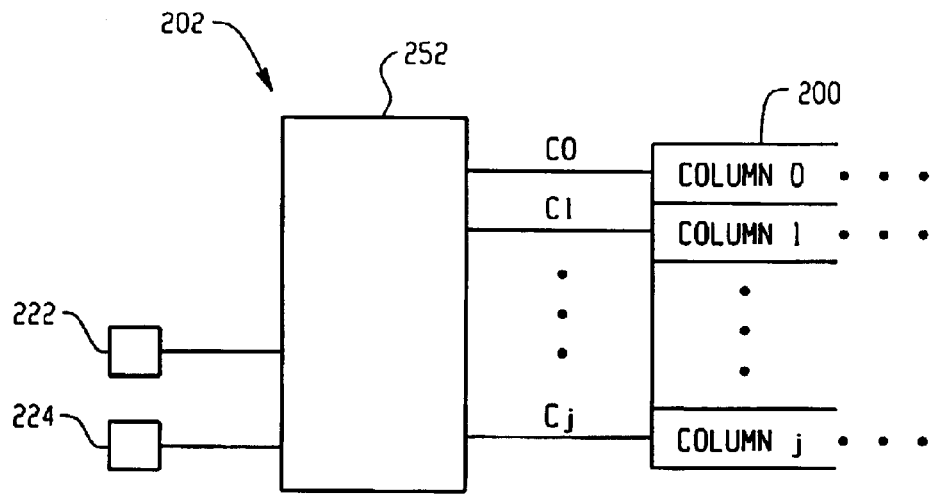
FIG. 2 is a block diagram of one embodiment of a redundant column addressing circuit for a redundant memory array.

FIG. 2 is a block diagram of one embodiment of the redundant column addressing circuit 202 for the redundant memory array 200. In this embodiment, the redundant column addressing circuit 202 comprises a shift register 252 having outputs corresponding to each respective redundant column C0, C1, C2 . . . Cj. For example, if the redundant memory array 200 comprises 16 redundant columns, then the shift register 252 can be realized by a 16-bit shift register. A corresponding selection bit in a 16-bit data structure may then be serially shifted into the shift register 252 from the first column signal pad 222 to select a corresponding column C0, C1, C2 . . . C16. The second column signal pad 224 may also be utilized as a clock signal to the shift register 252 as previously described.

The redundant row addressing circuit 212 may be realized in a similar manner as the redundant column addressing circuit 202 of FIG. 2. Thus, by selecting a redundant row R and redundant column C, the redundant memory array 200 may be tested for defects.

Figure 3:
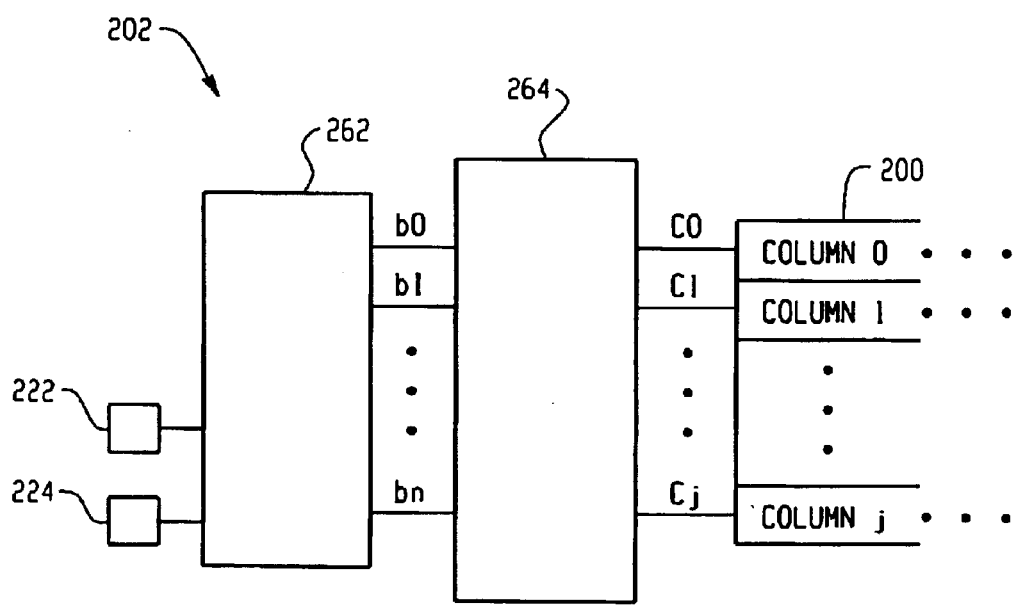
FIG. 3 is a block diagram of another embodiment of the redundant column addressing circuit for the redundant memory array.

FIG. 3 is a block diagram of another embodiment of the redundant column addressing circuit 202 for the redundant memory array 200. In this embodiment, the redundant column addressing circuit 202 comprises a shift register 262 and a decoder 264. The decoder includes a plurality of outputs C0, C1, C2 . . . Cj corresponding to each redundant column C0, C1, C2 . . . Cj. The decoder 264 output is selected from input selection bits b0 . . . bn. For example, if the redundant memory array comprises 16 redundant columns, then the decoder 264 may be realized by a 4:16 bit decoder. Accordingly, the shift register 262 may be realized by a 4-bit shift register. Thus, a four bit address may be serially shifted into the shift register 262 to select one of the 16 column outputs from the decoder 264. The second column signal pad 224 may also be utilized as a clock signal to the shift register 262 as previously described.

The redundant row addressing circuit 212 may be realized in a similar manner as the redundant column addressing circuit 202 of FIG. 3. Thus, by selecting a redundant row R and redundant column C, the redundant memory array 200 may be tested for defects.

Figure 4:
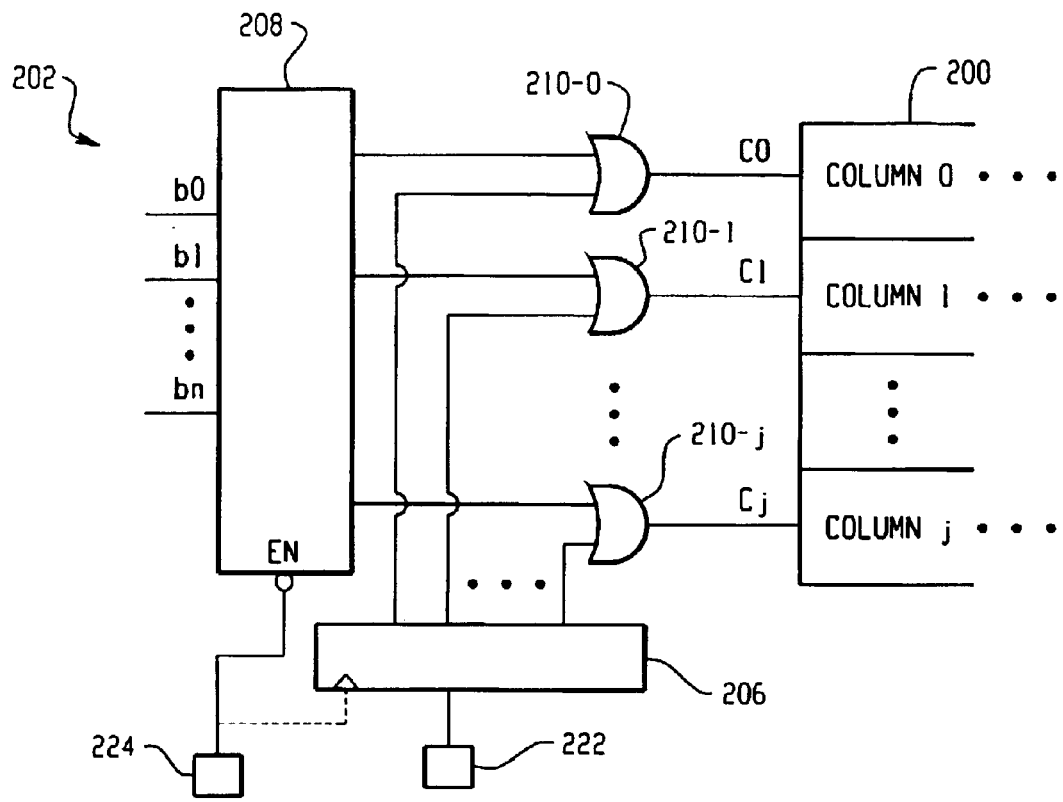
FIG. 4 is a block of another embodiment of the redundant column addressing circuit for the redundant memory array.

FIG. 4 is a block diagram of another embodiment of the redundant column addressing circuit 202 for the redundant memory array 200. In this embodiment, a first redundant column addressing circuit 206 includes a plurality of output selection bits to select one of the redundant columns C0, C1, C2 . . . Cj. The first redundant column addressing circuit 206 may be similar to the redundant column addressing circuits of FIGS. 2 and 3. A second redundant column addressing circuit 208 is operable to receive a plurality of selection bits b0 . . . bn and select a corresponding redundant column C0, C1, C2 . . . Cj. The second redundant column addressing circuit 208 is typically utilized during the normal operation of the semiconductor device 10 after testing and repair. In one embodiment, the second redundant column addressing circuit 208 is a decoder. The decoder is connected to the fuse bank 204 and is operable to select the redundant columns in the redundant memory array 200 based on the output of the fuse bank 204.

Either the first redundant column addressing circuit 206 or the second redundant column addressing circuit 208 may be used to access the redundant columns C0, C1, C2 . . . Cj. The corresponding outputs of the first and second redundant column addressing circuits 206 and 208 are provided to corresponding OR gates 210-0, 210-1 . . . 210-j. The redundant column serial selection data is provided to the first redundant column addressing circuit 206 via the first column signal pad 222. The column test signal is provided to an enable input of the second redundant column addressing circuit 208 and disables its respective outputs, and thus selects the outputs of the first redundant column addressing circuit 206 to select the redundant columns C0, C1, C2 . . . Cj.

The column test signal may also be utilized as a clock signal for the first redundant column addressing circuit 206 in a manner as previously described. Thus, during the testing of the redundant memory array 200, the columns of the redundant memory array 200 are selected by the first redundant column addressing circuit 206. After the testing and repair of the semiconductor device 10, and during normal operation, the columns of the redundant memory array 200 are selected by the second redundant column addressing circuit 208.

An example of the operation of the redundant column addressing circuit 202 is provided with reference to Tables 1–3 below. Table 1 provides a state table for the circuit of FIG. 4 illustrating the states of the addressing circuits 206 and 208 in response to data signals applied to the first and second column signal pads 222 and 224.

TABLE 1

State Table

| Pad 224 | Pad 222 | Addressing Circuit 208 | Addressing Circuit 206 | Operational Status |
|---------|---------|------------------------|------------------------|--------------------|
| 0 | X | Enabled | Disabled | Redundant Operational Mode |
| 1 | X | Disabled | Enabled | Redundant Test Mode |
| 0 -> 1 | 0 | Enabled -> Disabled | Disabled- Enabled | Transition From Redundant Operational Mode to Redundant Test Mode With Data 0 Clocked Into Addressing Circuit 206 |
| 0 -> 1 | 1 | Enabled -> Disabled | Disabled- Enabled | Transition From Redundant Operational Mode to Redundant Test Mode With Data 1 Clocked Into Addressing Circuit 206 |

The first redundant column addressing circuit 206 is configured to be clocked on a leading edge of a digital signal provided to the second column signal pad 224. The digital signal provided to the second column signal pad 224 is also used to selectively enable or disable the first and second redundant column addressing circuits 206 and 208.

When the second column signal pad 224 is low, the second redundant column addressing circuit 208 is enabled and the first redundant column addressing circuit 206 is disabled, and thus the redundant column addressing circuit 202 is in a redundant operational mode. During this mode, the second column addressing circuit 208 can be utilized to select a particular redundant column C0, C1, C2 . . . Cj for access during the normal operation of the semiconductor device 10, e.g., after testing and repair.

When the second column signal pad 224 is high, the second redundant column addressing circuit 208 is disabled and the first redundant column addressing circuit 206 is enabled, and the redundant column addressing circuit 202 is in a redundant test mode. The first redundant column addressing circuit 206 can be utilized to select a particular redundant column C0, C1, C2 . . . Cj for testing.

The first and second column addressing circuits 206 and 208 output low logic levels when they are in a disabled state and thus selection of a redundant column C0, C1, C2 . . . Cj by a disabled addressing circuit is prevented. The first redundant column addressing circuit 206, however, retains address information while in the disabled state so that address information serially shifted into the first redundant column addressing circuit 206 is not lost during the redundant operational mode. For example, if the first redundant column addressing circuit 206 is realized by the circuit similar to that of FIG. 3, comprising a shift register 262 and a decoder 264, then the second column signal pad 224 may be utilized as a clock signal to the shift register 262 as previously described, and may further be provided to the decoder 264 as a decoder enable signal. Other circuit configurations or devices may also be used.

Switching the digital signal at the second column signal pad 224 from 0 to 1 transitions the redundant column addressing circuit 202 from the redundant operational mode to the redundant test mode. If a 0 logic level is applied to the first column signal pad 222 during this transition, then a digital data value of 0 is clocked into the first redundant column addressing circuit 206. Likewise, if a 1 logic level is applied to the first column signal pad 222 during this transition, then a digital data value of 1 is clocked into the first redundant column addressing circuit 206. By toggling the signal applied to the second column signal pad 224 in conjunction with applying address bits to the first column signal pad 222, a particular address may be serially clocked into the first redundant column addressing circuit 206. Once the last bit of the address is clocked into the first redundant column addressing circuit 206, the second column signal pad 224 is held high and the redundant column addressing circuit 202 is then in the redundant test mode. The first redundant column addressing circuit 206 is used to select the particular redundant column corresponding to the particular address in the redundant test mode.

Table 2 below provides a transition table for the circuit of FIG. 4 illustrating the process of shifting a four bit address of 0011 into the first redundant column addressing circuit 206. The four bit address 0011 corresponds to the binary value of 3, and is thus input into the first redundant column addressing circuit 206 to select column C3 from 16 redundant columns C0, C1, C2 . . . C16 redundant column addressing circuit 206 may be implemented by a 4:16 bit column decoder operable to receive serial input data, or by a 4-bit shift register having four output bits connected as inputs to a 4:16 bit column decoder. Other circuit implementations may also be used.

TABLE 2

Transition Table

| State | Pad 224 | Pad 222 | Addressing Circuit 206 Address | Addressing Circuit 206 Column Selected |
|---|---|---|---|---|
| 0 | 0 (1 -> 0) | X | 0001 | — |
| 1 | 0 -> 1 | 1 | 1000 | C8 |
| 2 | 1 -> 0 | X | 1000 | — |
| 3 | 0 -> 1 | 1 | 1100 | C12 |
| 4 | 1 -> 0 | X | 1100 | — |
| 5 | 0 -> 1 | 0 | 0110 | C6 |
| 6 | 1 -> 0 | X | 0110 | — |
| 7 | 0 -> 1 | 0 | 0011 | C3 |
| 8 (7) | 1 | X | 0011 | C3 |

State 0 occurs after a redundant column C0, C1, C2 . . . C16 has been tested, or during an initialization of the first redundant column addressing circuit 206. In this example, during state 0, the first redundant column addressing circuit 206 stores an address of 0001, corresponding to the redundant column C1. The address 0001 may be stored as the result of a previous test, or may be stored as an initial address as a result of initialization. However, because the second column signal pad 224 is low, the output of the first redundant column addressing circuit 206 is disabled. Accordingly, the redundant columns are selected by the second redundant column addressing circuit 208.

During state 1, the digital signal at the second column signal pad 224 transitions from a 0 to a 1 and the redundant column addressing circuit 202 transitions from the redundant operational mode to the redundant test mode. A bit value of 1 is shifted into the first redundant column addressing circuit 206, and the four bit address is shifted down, with the least significant bit (bit 1 of state 0) being removed. At the end of state 1, the first redundant column addressing circuit 206 stores an address of 1000, corresponding to redundant column C8.

During state 2, the digital signal at the second column signal pad 224 transitions from a 1 to a 0, and the redundant column addressing circuit 202 transitions from the redundant test mode to the redundant operational mode. To shift the remainder of the four bit address 0011 into the first redundant column addressing circuit 206, states 3–7 are executed. After transitioning through states 3–7, the four bit address 0011 is shifted into the first redundant column addressing circuit 206. The four bit address 0011 is decoded to select column C3. Testing of the selected column C3 is conducted during state 8, which is attained by holding the digital signal at the second column signal pad 224 in the high state achieved at the end of state 7.

States 0–8 may then be repeated to select another column. Alternatively, only a subset of states 0–7 may be repeated to select another column. For example, if the next redundant column to be tested after redundant column C3 is redundant column C9, then shifting a bit 1 value into the first column addressing circuit 208 will cause the selection of redundant column C9. By way of a further example, a series of address bits may be serially shifted into the redundant column addressing circuit 206 so that all redundant columns C0, C1, C2 . . . C16 are selected in a non-sequential manner to minimize clock cycles. Table 3 provides a minimal shift pattern to select the redundant columns C0, C1, C2 . . . C16 in a manner such that the clock cycles are minimized. For this shift pattern shown, the bits are shifting into the least significant bit (LSB) position of the address, and the most significant bit (MSB) is shifted out of the address.

TABLE 3

Minimal Shift Pattern

| Pad 224 Cycle No. | LSB | b3 | b2 | b1 | b0 | Selected Column |
|---|---|---|---|---|---|---|
| 1 | 1 | 0 | 0 | 0 | 1 | 1 |
| 2 | 0 | 0 | 0 | 1 | 0 | 2 |
| 3 | 0 | 0 | 1 | 0 | 0 | 4 |
| 4 | 1 | 1 | 0 | 0 | 1 | 9 |
| 5 | 1 | 0 | 0 | 1 | 1 | 3 |
| 6 | 0 | 0 | 1 | 1 | 0 | 6 |
| 7 | 1 | 1 | 1 | 0 | 1 | 13 |
| 8 | 0 | 1 | 0 | 1 | 0 | 10 |
| 9 | 1 | 0 | 1 | 0 | 1 | 5 |
| 10 | 1 | 1 | 0 | 1 | 1 | 11 |
| 11 | 1 | 0 | 1 | 1 | 1 | 7 |
| 12 | 1 | 1 | 1 | 1 | 1 | 15 |
| 13 | 0 | 1 | 1 | 1 | 0 | 14 |
| 14 | 0 | 1 | 1 | 0 | 0 | 12 |
| 15 | 0 | 1 | 0 | 0 | 0 | 8 |
| 16 | 0 | 0 | 0 | 0 | 0 | 0 |

By thus selecting a minimal shift pattern for an n-bit address corresponding to n:$2^n$ decoder, the redundant columns C0, C1, C2 . . . C($2^n$) may be selected and tested by n clock selection cycles.

The redundant row addressing circuit 212 may be realized in a similar manner as the redundant column addressing circuit 202 of FIG. 4. Thus, by selecting a redundant row R and redundant column C, the redundant memory array 200 may be tested for defects.

Other logic implementations may also be utilized to substitute the outputs of the second redundant column addressing circuit 208 with the outputs of the first redundant column addressing circuit 206 during testing. For example, these other logic implementations may include NAND, AND, NOR and other logic gates instead of the OR gates shown. Thus, by providing a means for substituting the outputs of the second redundant column addressing circuit 208 with the outputs of the first redundant column addressing circuit 206 during testing, addressing circuit complexity can be minimized. Additionally, by providing a means to test the redundant memory array 100 using serial selection data, space on the semiconductor device 10 can be conserved.

Figure 5:
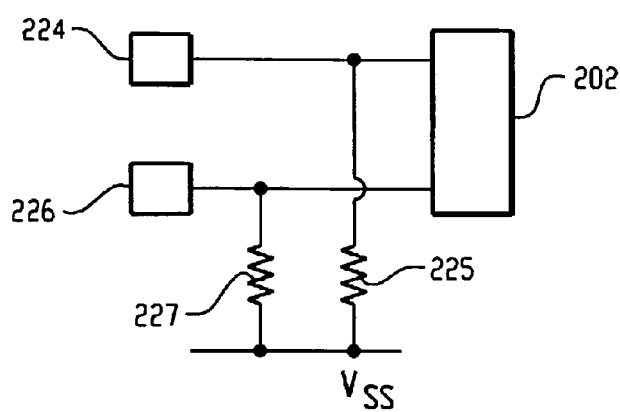
FIG. 5 is a schematic diagram of first and second column signal pads.

FIG. 5 provides a schematic diagram of the first and second column signal pads 224 and 226. In one embodiment, each column signal pad 224 and 226 is connected to a potential $V_{ss}$ by resistors 225 and 227, respectively. Each column signal pad 224 and 226 receives data signals via test probes from the testing device 300 and that are brought into contact with the signal pads 224 and 226 during testing. The resistors 225 and 227 allow the data signals to be provided to the redundant column addressing circuitry 202 when the data signals are applied to the signal pads 224 and 226. However, when the data signals are not applied to the signal pads 224 and 226, the signal pads are tied to the potential $V_{ss}$, and are thus prevented from floating at a potential different than $V_{ss}$. $V_{ss}$ may be a ground potential, a negative bias voltage, or voltage of lower magnitude than $V_{dd}$.

In another embodiment, each column signal pad 224 and 226 is connected to a potential $V_{dd}$ by resistors 225 and 227, respectively. This embodiment is similar to the embodiment of FIG. 5, except that the signal pads are tied to the potential $V_{dd}$, and are thus prevented from floating at a potential different than $V_{dd}$ when the data signals are not applied to the signal pads 224 and 226.

Figure 6:
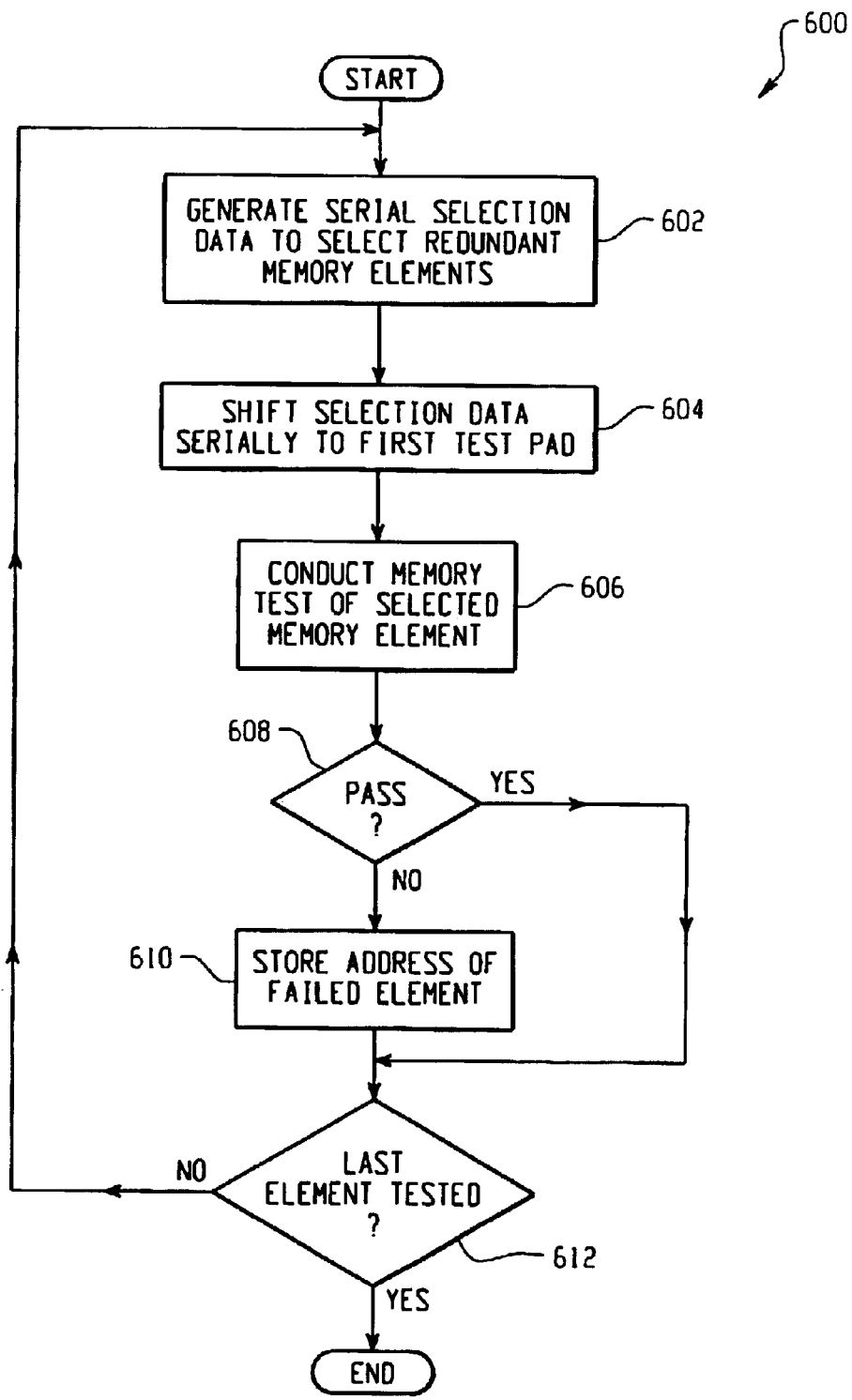
FIG. 6 is a flow diagram of a method of testing redundant memory elements in a semiconductor device.

FIG. 6 provides a flow diagram 600 of a method of testing redundant memory elements in a semiconductor device. The method 600 may be realized by executing a set of computer instructions on a computer device, such as the test device 300.

At step 602, serial selection data for selecting redundant memory elements is generated. The content of the serial selection data may depend on the particular addressing circuitry used to access the redundant memory elements. In the embodiment of FIG. 2, for example, the serial selection data may comprise a single bit that is to be shifted to an output corresponding to a redundant column C0, C1 . . . Cj that is to be selected, and a single bit that is to be shifted to an output corresponding to a redundant row R0, R1 . . . Rk that is to be selected. In the embodiment of FIG. 3, however, the serial selection data may comprise an n-bit word that is decoded to select a corresponding column C0, C1 . . . Cj, and an n-bit word that is decoded to select a corresponding row R0, R1 . . . Rk. Other serial selection data may also be generated, depending on the particular redundant column and row addressing circuitry implemented.

At step 604, the serial selection data is provided in serial to the first test pad. The serial selection data may be clocked according to a system clock on the semiconductor device, or by a separate clock, or by utilizing a test enable signal as a clock as previously described. A corresponding memory element is selected in response to the serial selection data provided.

At step 606, a memory test of the selected memory element is conducted. The memory test may be a simple read/write operation, or may measure a number of performance characteristics, such as standby current, data retention, memory access time, etc., to determine whether the selected memory element meets a performance specification.

In step 608, it is determined whether the selected memory element has passed the memory test. If the selected memory element does not meet the performance specification, then the selected memory element has failed and is considered defective. Step 610 is then executed, in which the address of the defective memory element is stored in the test device 300. If the selected memory element does meet the performance specification, however, then step 612 is executed.

Step 612 determines if there are additional memory elements to be tested. If there are no additional memory elements to be tested, then the testing of the redundant memory elements is complete. If there are additional memory elements to be tested, however, then steps 602, 604, 606, 608, 610 and 612 are repeated.

The semiconductor device 10 thus provides a system and method for testing redundant memory elements in the redundant memory array 200. The system and method described in this written description can provide a means to test the redundant memory array 100 using serial selection data to minimize the number of supporting test signal pads and thereby conserve space on the semiconductor device 10. The system and method described in this written description can also provide a means for addressing the redundant memory array 200 during testing, and thus addressing circuit complexity can be minimized.

Of course, variations of the embodiments described herein exist. For example, depending on the number of redundant rows and redundant columns, the second column signal pad 224 and the second row signal pad 234 may be combined into a single pad to provide the test enable signal for both the redundant column addressing circuit 202 and the redundant row addressing circuit 212.

Figure 7:
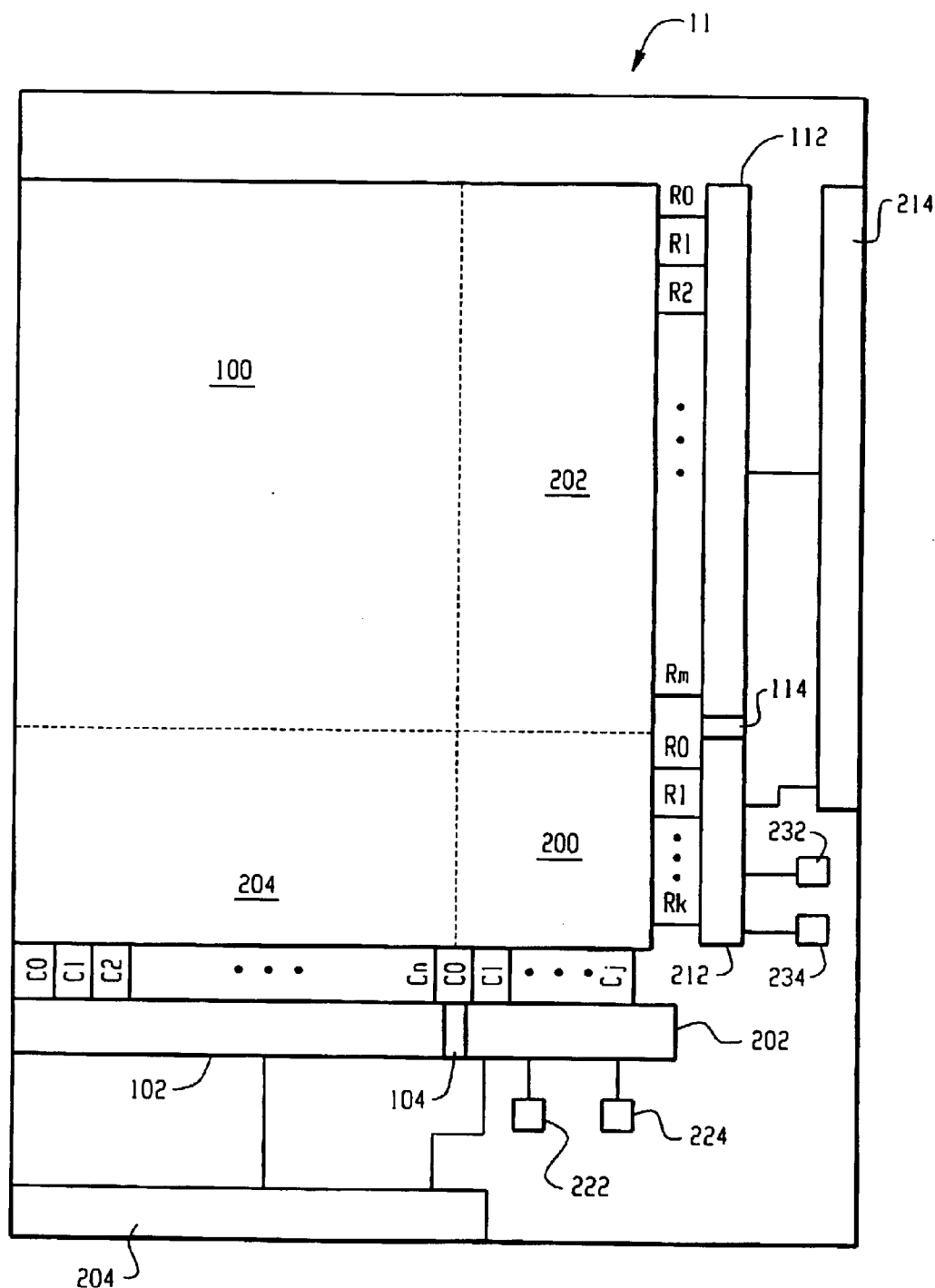
FIG. 7 is a block diagram of another illustrative semiconductor device including redundant addressing and test circuitry for redundant memory elements.

Additionally, the systems and methods disclosed herein are not limited to the particular semiconductor device 10 architecture depicted in FIG. 1. FIG. 7, for example, provides a block diagram of another illustrative semiconductor device 11 that includes redundant addressing and test circuitry for redundant memory elements. The semiconductor device 11 includes a primary memory array 100 and a redundant memory array 200. Instead of the separate redundant memory array of FIG. 1, the redundant memory array 200 of FIG. 7 is defined by redundant columns 202 and redundant rows 204 located on the periphery of the primary memory array 100. In all other respects, the semiconductor device 11 functions in a similar manner to the semiconductor device 10 of FIG. 1.

Finally, this written description uses illustrative embodiments to disclose the invention, including the best mode, and also to enable a person of ordinary skill in the art to make and use the invention. Other embodiments are within the scope of the claims if they have elements that do not differ from the literal language of the claims, or have equivalent elements.

What is claimed is:

1. A semiconductor device, comprising:
    a primary memory array comprising primary memory elements operable to store data;
    a primary addressing circuit operable to select the primary memory elements;
    a redundant memory array comprising redundant memory elements operable to store data, the redundant memory array operable to be programmed from a programmable state to provide redundant memory elements for defective primary memory elements;
    a first signal pad operable to receive serial selection data; and
    a redundant addressing circuit connected to the first signal pad and operable to select the redundant memory elements, and further operable to receive the serial selection data from the first signal pad and to select the redundant memory elements in response thereto.

2. The semiconductor device of claim 1, wherein the redundant addressing circuit comprises a shift register operable to receive the serial selection data as input and in response output first selection bits for selecting the redundant memory elements.

3. The semiconductor device of claim 2, wherein the redundant addressing circuit further comprises a decoder operable to receive the first selection bits as input and in response to select one of the redundant memory elements.

4. The semiconductor device of claim 2, wherein the redundant addressing circuit further comprises:
    a decoder operable to generate decoder output bits, each decoder output bit corresponding to a redundant memory element; and
    a plurality of OR gates, each OR gate receiving as input a first selection bit from the shift register and a decoder output bit and operable to output a corresponding memory element selection signal based on the first selection bit and the decoder output bit.

5. The semiconductor device of claim 2, wherein the primary addressing circuit is operable to disable selection of the primary memory elements when serial selection data is provided from the first signal pad.

6. The semiconductor device of claim 2, wherein the redundant memory elements comprise columns.

7. The semiconductor device of claim 1, further comprising a second signal pad operable to receive test enable data, and wherein the primary addressing circuit is operable to receive the test enable data and in response to disable selection of the primary memory elements.

8. The semiconductor device of claim 7, wherein the redundant addressing circuit comprises a shift register operable to receive the serial selection data as data input and the test enable data as a clock input and in response to output first selection bits for selecting the redundant memory elements.

9. The semiconductor device of claim 8, wherein the redundant addressing circuit further comprises a decoder operable to receive the first selection bits as input and in response to select one of the redundant memory elements.

10. The semiconductor device of claim 8, wherein the redundant addressing circuit further comprises:
    a decoder operable to generate decoder output bits, each decoder output bit corresponding to a redundant memory element; and
    a plurality of OR gates, each OR gate receiving as input a first selection bit from the shift register and a decoder output bit and operable to output a corresponding memory element selection signal based on the first selection bit and the decoder output bit.

11. The semiconductor device of claim 2, wherein the primary addressing circuit is operable to disable selection of the primary memory elements when serial selection data is provided from the first signal pad.

12. The semiconductor device of claim 2, wherein the redundant memory elements comprise columns.

13. The semiconductor device of claim 7, wherein the redundant addressing circuit comprises a shift register operable to receive the serial selection data as data input and a clock signal as a clock input and in response to output first selection bits for selecting the redundant memory elements.

14. The semiconductor device of claim 13, wherein the redundant addressing circuit further comprises a decoder operable to receive the first selection bits as input and in response to select one of the redundant memory elements.

15. The semiconductor device of claim 2, wherein the primary addressing circuit is operable to disable selection of the primary memory elements when serial selection data is provided from the first signal pad.

16. The semiconductor device of claim 1, wherein the first signal pad is connected to a power bus by a resistor.

17. The semiconductor device of claim 1, wherein the primary memory array and the redundant memory array comprise MRAM arrays.

18. A semiconductor device, comprising:
    a primary memory array comprising primary columns and primary rows, the primary memory array operable to store data;
    a primary addressing circuit operable to select the primary columns and primary rows;
    a redundant memory array comprising redundant columns and redundant rows, the redundant memory array operable to store data and operable to be programmed from a programmable state to provide the redundant columns and redundant rows for defective primary columns and primary rows;
    a column signal pad operable to receive column serial selection data;
    a row signal pad operable to receive row serial selection data; and a redundant addressing circuit connected to the column and row signal pads and operable to select the redundant columns and redundant rows, and further operable to receive the column serial selection data from the column signal pad and to select a corresponding redundant column in response, and to receive the row serial selection data from the row signal pad and to select a corresponding redundant row in response.

19. The semiconductor device of claim 18, wherein the redundant addressing circuit comprises:
   a first shift register operable to receive the column serial selection data as input and in response to output column selection bits for selecting a corresponding redundant column; and
   a second shift register operable to receive the row serial selection data as input and in response to output row selection bits for selecting a corresponding redundant row.

20. The semiconductor device of claim 19, wherein the redundant addressing circuit further comprises:
   a first decoder connected to the first shift register and operable to receive the column selection bits as input and in response to select the corresponding redundant column; and
   a second decoder connected to the second shift register and operable to receive the row selection bits as input and in response to select the corresponding redundant row.

21. The semiconductor device of claim 20, wherein the primary addressing circuit is operable to disable selection of the primary columns and primary rows when column serial selection data and row serial selection data are provided from the column and row signal pads, respectively.

22. The semiconductor device of claim 19, further comprising:
   a column test signal pad operable to receive column test enable data; and
   a row test signal pad operable to receive row test enable data;
   wherein the primary addressing circuit is operable to receive the column test enable data and the row test enable data and in response disable selection of the primary columns and primary rows.

23. The semiconductor device of claim 22, wherein the redundant addressing circuit comprises:
   a first shift register operable to receive the column serial selection data as data input and the column test enable data as a clock input and in response to output column selection bits for selecting a corresponding redundant column; and
   a second shift register operable to receive the row serial selection data as data input and the row test enable data as a clock input and in response output row selection bits for selecting a corresponding redundant row.

24. The semiconductor device of claim 23, wherein the redundant addressing circuit comprises:
   a first shift register operable to receive the column serial selection data as data input and a clock input signal and in response to output column selection bits for selecting a corresponding redundant column; and
   a second shift register operable to receive the row serial selection data as data input and a clock input signal and in response to output row selection bits for selecting a corresponding redundant row.

25. The semiconductor device of claim 22, wherein the primary addressing circuit is operable to disable selection of the primary columns and rows when column serial selection data and row serial selection data are provided from the column and row signal pads, respectively.

26. A semiconductor device, comprising:
   primary memory means for storing data;
   redundant memory means for storing data and for providing redundant memory elements for defective primary memory means;
   input means for providing serial test data for the redundant memory means;
   primary addressing means for addressing the primary memory means and for disabling accessing of the primary memory means when the input means provides the serial test data; and
   redundant addressing means for addressing the redundant memory means and for receiving the serial test data for accessing the redundant memory means.

27. The semiconductor device of claim 26, wherein the redundant addressing means comprises decoder means operable to select the redundant memory means.

28. The semiconductor device of claim 27, wherein the redundant addressing means further comprises shift means for shifting serial test data provided to the input means, and wherein the decoder means is further for receiving the shifted serial test data and for selecting the redundant memory means in response.

29. The semiconductor device of claim 28, wherein the input means comprises:
   first input means for receiving serial address data; and
   second input means for receive test enable data.

* * * * *